United States Patent
Cruickshank et al.

(10) Patent No.: US 6,529,032 B1
(45) Date of Patent: Mar. 4, 2003

(54) METHODS AND APPARATUS FOR FULL I/O FUNCTIONALITY AND BLOCKING OF BACKDRIVE CURRENT

(75) Inventors: Ancil B. Cruickshank, Earlysville, VA (US); A. Alan Tuten, Stuarts Draft, VA (US); Michael G. Smith, Charlottesville, VA (US); Joseph J. Cieri, Graves Mill, VA (US); Ronald E. Gareis, Charlottesville, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/542,267

(22) Filed: Apr. 4, 2000

(51) Int. Cl.[7] .................. H03K 19/007; H03K 17/16

(52) U.S. Cl. .................... 326/14; 326/21; 326/56; 710/52

(58) Field of Search ................ 326/21, 56–58, 326/82, 14; 713/300, 320, 324; 710/52, 105, 106

(56) References Cited

U.S. PATENT DOCUMENTS

| | | | | |
|---|---|---|---|---|
| 4,761,565 A | * | 8/1988 | Kannegundla | 307/243 |
| 5,146,563 A | * | 9/1992 | Donaldson et al. | 395/250 |
| 5,218,682 A | * | 6/1993 | Frantz | 710/105 |
| 5,397,941 A | * | 3/1995 | Merrill | 326/68 |
| 5,880,602 A | * | 3/1999 | Kaminaga et al. | 326/81 |
| 6,121,795 A | * | 9/2000 | Curd et al. | 326/83 |

* cited by examiner

Primary Examiner—Daniel D. Chang
(74) Attorney, Agent, or Firm—Karl A. Vick, Esq.; Armstrong Teasdale LLP

(57) ABSTRACT

An input/output (I/O) port designed for electrical interconnection with multiple similar ports includes an input read circuit, an output drive circuit, and a circuit to control the port for input or output mode by electrically disconnecting the output drive circuit from the port. Also included is a back drive current protection circuit placed in series in between an external I/O line and the input read and output drive circuits which blocks backdrive currents from other active processors when the processor that includes the protection circuit is in a powered down state while still allowing full input/output functionality in a powered up state.

14 Claims, 1 Drawing Sheet

METHODS AND APPARATUS FOR FULL I/O FUNCTIONALITY AND BLOCKING OF BACKDRIVE CURRENT

BACKGROUND OF THE INVENTION

This invention relates generally to parallel processing of I/O ports in an electronic system and more specifically to the problems associated with electronic isolation between circuits when I/O ports of distinct, separate controllers are connected in common in an electronic system.

In known electronic systems, parallel processors or controllers are sometimes used to perform or control the functions of the system and in other applications multiple processors are used where redundancy of the system is desired. A drawback to this functionality or redundancy is that a number of the I/O ports of the separate processors or controllers may be electrically connected together creating common I/O points.

For example, in a system using redundant processors, a first processor can be characterized as a primary processor and a second processor can be characterized as a secondary processor. As long as the primary processor is functioning properly, it is possible to leave the secondary processor in a powered down state. However, the I/O ports of the powered down processor are still electrically connected to the active circuit at the common I/O points and the powered down processor may be re-powered by the active processor through the common I/O points, which is known as backdrive current. Backdrive currents may result in processing errors and increased power consumption by the electronic system. It would be desirable to eliminate the detrimental effects of backdrive currents produced by secondary processors and controllers while retaining the full I/O capabilities and diagnostic features of the redundant system.

BRIEF SUMMARY OF THE INVENTION

An input/output (I/O) port for electrical interconnection with multiple similar ports includes an input read circuit, an output drive circuit, a circuit to control the port for input or output mode by electrically disconnecting the output drive circuit from the port, and a back drive current protection circuit placed in series between an external I/O line and the input read and output drive circuits.

DETAILED DESCRIPTION OF THE INVENTION

Figure 1:
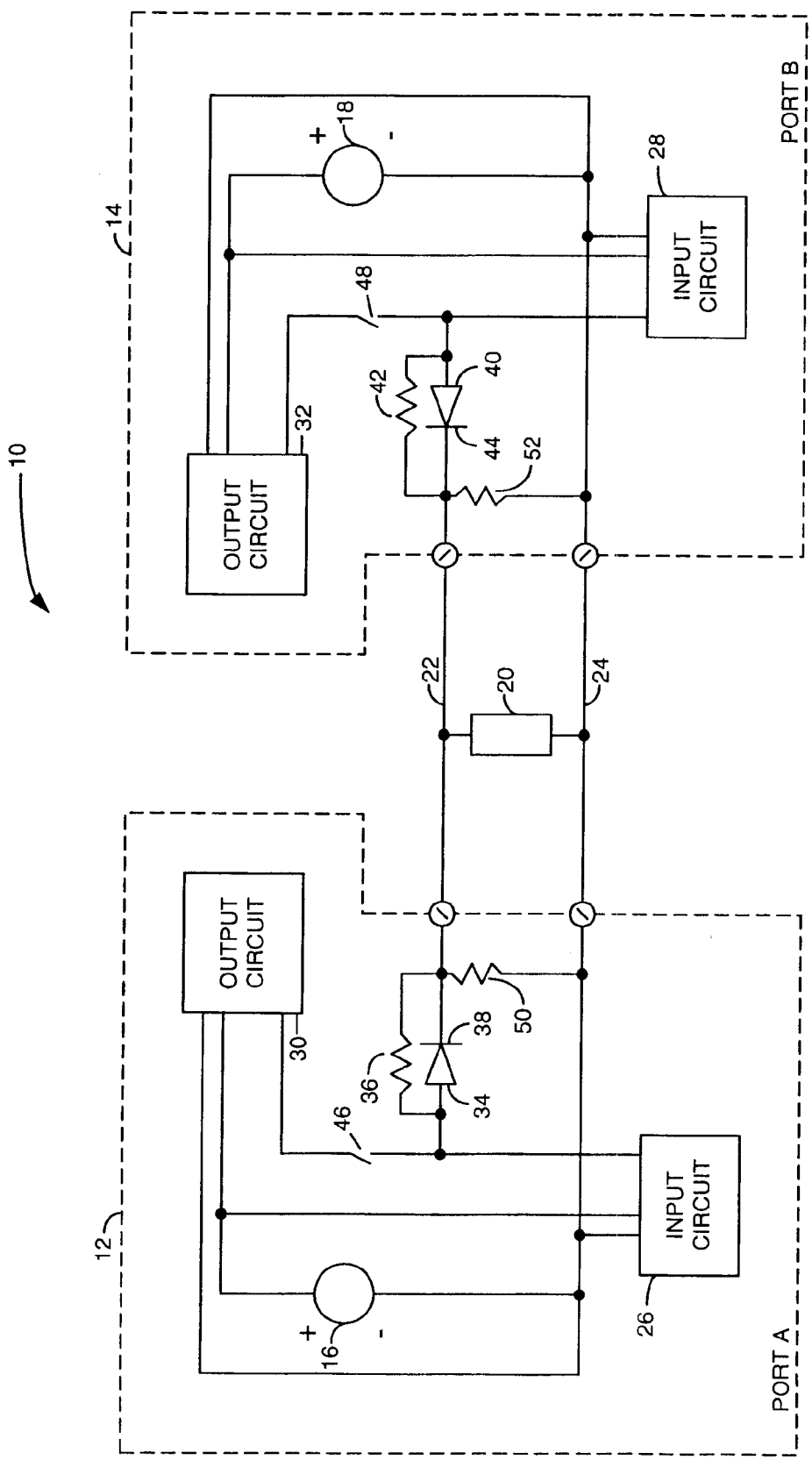
FIG. 1 is a schematic of two electrically connected I/O ports according to one embodiment of the present invention.

FIG. 1 is a circuit schematic 10 of two I/O controller ports, port 12 and port 14 electrically connected at a common point. The I/O controller ports 12 and 14 are each part of a separate I/O controller or processor and have distinct, separate sources of power, supply 16 for port 12 and supply 18 for port 14. Device 20 is electrically connected across an I/O line 22 and a return or ground line 24 and denotes a signal source for input circuit 26 in I/O controller port 12 and for input circuit 28 in I/O controller port 14. Device 20 also denotes a circuit to be driven from output circuit 30 of I/O controller port 12 and from output circuit 32 of I/O controller port 14. A diode 34 and shunt resistor 36 are connected in parallel, and the diode 34 and shunt resistor 36 parallel combination is connected in series with I/O line 22 in port 12. A node of the parallel combination of diode 34 and shunt resistor 36 containing a cathode 38 of diode 34 is connected to I/O line 22. Similarly, port 14 contains a diode 40 and a shunt resistor 42 connected in parallel, the combination in series with I/O line 22 and connected to a cathode 44 of diode 40 of I/O line 22 as described for port 12. Switch 46 within port 12 and switch 48 within port 14 symbolize known electronic circuits which have the electrically equivalency of being an open switch when the port is in an input or read mode. In an output or write mode, switches 46 and switch 48 can be commanded to be closed (ON) or open (OFF).

Referring to port 12, diode 34 and shunt resistor 36 are placed in series with I/O line 22 such that the common I/O point, I/O line 22, can operate, selectively, as an output with feedback, or as an input under control of a processor or controller. When port 12 is in an output mode, denoted by switch 46 being closed, diode 34 begins to conduct current and effectively becomes a short circuit, shorting out shunt resistor 36, thereby allowing full output and diagnostic capabilities. When port 12 is in an input mode, denoted by switch 46 being open, an ON/OFF state of device 20 is reflected by a voltage across a preload resistor 50. The voltage across preload resistor 50, which is "read" by the controller or processor by being "shunted" across shunt resistor 36, thereby bypassing diode 38, to input circuit 26. Port 14 also contains a preload resistor 52 and the description of port 12 operation, above, is equivalent for port 14.

Referring again to port 12, diode 34 and shunt resistor 36 prevent unwanted backdrive current into port 12. In typical redundancy scenarios, two or more processors or controllers may be connected in parallel, with each processor or controller being powered by its own unique power source. In the simple two port example of FIG. 1, the common I/O point, I/O line 22, is used to drive a common load or to monitor a common input device. Diode 34 and shunt resistor 36 prevent a powered down controller of port 12 from being unintentionally being repowered from the common I/O point, I/O line 22, that is shared with the controller of port 14. Diode 34 provides the backdrive protection. However, shunt resistor 36 which is mainly used to provide input feedback regarding the state of switch 46, also limits any currents entering the powered down controller to a level insufficient to repower the powered down controller of port 12, thereby avoiding any possible instability problems. It is to be noted that FIG. 1 does not represent a physical layout for ports 12 and 14, rather FIG. 1 represents the functionality of ports 12 and 14.

The terms controller and processor, as used herein, refers to microprocessors, microcontrollers, programmable logic controllers, input/output (I/O) controllers, reduced instruction set circuits (RISC), application specific integrated circuits (ASIC), logic circuits, and any other circuit or processor capable of sharing common I/O points within an electronic system.

While the invention has been described in terms of various specific embodiments, those skilled in the art will recognize that the invention can be practiced with modification within the spirit and scope of the claims.

What is claimed is:

1. An input/output (I/O) port comprising:
   an external I/O line;
   an input read circuit;
   an output drive circuit;
   a circuit for electrically disconnecting said output drive circuit from said port; and a back drive current protection circuit electrically connected in series between said external I/O line and said input read circuit and said output drive circuit, said back drive current protection circuit further comprises a resistor and a diode connected in parallel.

2. An input/output (I/O) port according to claim 1 wherein said diode is oriented such that a cathode of said diode is electrically connected to said external I/O line.

3. An input/output (I/O) port according to claim 1 further comprising a load resistor electrically connected between said external I/O line of said I/O port and an electrical return line of said I/O port.

4. An I/O port in accordance with claim 1 wherein said back drive current protection circuit is electrically configured to permit current flow in both directions.

5. A system comprising multiple processors, said processors each comprising at least one input/output (I/O) port, a powered down state and a re-powered state, said I/O ports electrically connected with one another, said I/O ports comprising:

an external I/O line; and a back drive current protection circuit for eliminating back drive currents comprising a resistor and a diode connected in parallel, said back drive current protection circuit configured to prevent a powered down processor from re-powering.

6. A system according to claim 5 wherein said back drive current protection circuit is electrically connected in series between said external I/O lines of said processors and input read and output drive circuits within said processors.

7. A system according to claim 5 wherein said diode is oriented such that a cathode of said diode is electrically connected to said external I/O lines of said processors.

8. An system according to claim 7 said back drive current protection circuit further comprises a load resistor electrically connected between said external I/O lines and an electrical return line of said external I/O line of said processor.

9. A system according to claim 5 wherein said back drive current protection circuit is electrically configured to permit current flow in both directions.

10. A method for eliminating current back drive in a multiple processor system while allowing full input/output capability, each processor comprising a powered down state and a re-powered state, said method comprising the steps of:

installing a back drive current protection circuit including a resistor and a diode in parallel within each input/output (I/O) port of each processor;

electrically connecting at least one I/O port of one of the multiple processors with at least one I/O port of another of the multiple processors; and preventing a powered down processor from re-powering using the back drive current protection circuit.

11. A method according to claim 10, each input/output (I/O) port including an external I/O line, wherein said step of installing a back drive current protection circuit within each I/O port further comprises the step of electrically connecting the back drive current protection circuit in series between the external I/O lines of the processors and input read and output drive circuits of the processors.

12. A method according to claim 11 wherein said step of electrically connecting the back drive current protection circuit further comprises the step electrically connecting a load resistor between the external I/O lines of the processors and an electrical return of the external I/O lines of said processors.

13. A method according to claim 10 wherein said step of installing a back drive current protection circuit further comprises the step of orienting the diode such that a cathode of the diode is electrically connected to the external I/O lines of the processors.

14. A method according to claim 10 wherein said step of electrically connecting the back drive protection circuit further comprises the step of electrically configuring the back drive current protection circuit to permit current flow in both directions.

* * * * *

UNITED STATES PATENT AND TRADEMARK OFFICE
CERTIFICATE OF CORRECTION

PATENT NO. : 6,529,032 B1
DATED : March 4, 2003
INVENTOR(S) : Cruickshank et al.

It is certified that error appears in the above-identified patent and that said Letters Patent is hereby corrected as shown below:

<u>Column 3,</u>
Line 34, delete "An", insert therefor -- A --.
Line 37, delete "processor", insert therefor -- processors --.

Signed and Sealed this

Twenty-fifth Day of November, 2003

JAMES E. ROGAN
*Director of the United States Patent and Trademark Office*